US011682462B2

(12) United States Patent
Kavalipurapu et al.

(10) Patent No.: US 11,682,462 B2
(45) Date of Patent: *Jun. 20, 2023

(54) CHARGE LOSS COMPENSATION

(71) Applicant: Micron Technology, Inc., Boise, ID (US)

(72) Inventors: Kalyan Chakravarthy C. Kavalipurapu, Hyderabad (IN); Jung Sheng Hoei, Newark, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/390,142

(22) Filed: Jul. 30, 2021

(65) Prior Publication Data

US 2021/0358556 A1 Nov. 18, 2021

Related U.S. Application Data

(63) Continuation of application No. 16/800,678, filed on Feb. 25, 2020, now Pat. No. 11,081,189.

(51) Int. Cl.
*G11C 16/26* (2006.01)
*G11C 16/34* (2006.01)
*G11C 11/56* (2006.01)

(52) U.S. Cl.
CPC .......... *G11C 16/26* (2013.01); *G11C 11/5642* (2013.01); *G11C 16/3427* (2013.01)

(58) Field of Classification Search
CPC .................................................... G11C 16/26
See application file for complete search history.

(56) References Cited

U.S. PATENT DOCUMENTS

| 10,242,747 | B1 | 3/2019 | Patel |
| 10,607,708 | B2 * | 3/2020 | Oh ................... G11C 29/50004 |
| 11,081,189 | B1 * | 8/2021 | Kavalipurapu ...... G11C 16/349 |
| 2012/0102259 | A1 | 4/2012 | Goss et al. |
| 2016/0110124 | A1 | 4/2016 | Camp et al. |
| 2018/0158493 | A1 | 6/2018 | Ryu |
| 2018/0277228 | A1 * | 9/2018 | Takada ................ G11C 11/5671 |

(Continued)

FOREIGN PATENT DOCUMENTS

| CN | 113380305 | 9/2021 |
| CN | 113380305 B | 10/2022 |

OTHER PUBLICATIONS

"Chinese Application Serial No. 202110215005.6, Office Action dated Feb. 21, 2022", w English translation, 9 pgs.

(Continued)

*Primary Examiner* — Min Huang
(74) *Attorney, Agent, or Firm* — Schwegman Lundberg & Woessner, P.A.

(57) ABSTRACT

Disclosed in some examples are methods, systems, devices, and machine-readable mediums for compensating for charge loss effects. In some examples, a charge loss may be estimated by a charge loss monitor for a particular unit of a NAND device and may be utilized to select a charge loss compensation scheme. The charge loss may be estimated by the charge loss estimation process by determining a reference read voltage and calculating a bit count resulting from a read at that reference read voltage. The number of bits returned may be used to select the particular charge loss compensation scheme.

17 Claims, 10 Drawing Sheets

(56) References Cited

U.S. PATENT DOCUMENTS

2019/0348130 A1* 11/2019 Reuter ................. G11C 29/028
2020/0135264 A1   4/2020 Brady
2021/0264988 A1   8/2021 Kavalipurapu et al.

OTHER PUBLICATIONS

"Chinese Application Serial No. 202110215005.6, Response filed May 20, 2022 to Office Action dated Feb. 21, 2022", w/ English claims, 10 pgs.
"Korean Application Serial No. 10-2021-0025799, Notice of Preliminary Reasons for Refusal dated Jul. 20, 2022", w/ English Translation, 10 pgs.
"Korean Application Serial No. 10-2021-0025799, Response filed Sep. 20, 2022 to Notice of Preliminary Reasons for Refusal dated Jul. 20, 2022", w/ English Claims, 19 pgs.
"Chinese Application Serial No. 202110215005.6, Voluntary Amendment filed Dec. 23, 2021", w English Claims, 20 pgs.
"Korean Application Serial No. 10-2021-0025799, Final Office Action dated Jan. 26, 2023", with English translation, 8 pages.

\* cited by examiner

CHARGE LOSS COMPENSATION

PRIORITY APPLICATION

This application is a continuation of U.S. application Ser. No. 16/800,678, filed Feb. 25, 2020, which is incorporated herein by reference in its entirety.

FIELD OF INVENTION

Embodiments pertain to memory devices. Some embodiments relate to handling charge loss and read disturb effects of memory devices.

BACKGROUND

Memory devices for computers or other electronic devices may be categorized as volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), static RAM (SRAM), erasable programmable ROM (EPROM), resistance variable memory, phase-change memory, storage class memory, resistive random-access memory (RRAM), and magnetoresistive random-access memory (MRAM), among others.

Flash memory is utilized as non-volatile memory for a wide range of electronic applications. Flash memory devices typically include one or more groups of transistors such as floating gate or charge trap memory cells that allow for high memory densities, high reliability, and low power consumption.

Transistor-based memory devices store bits by discriminating charge levels stored in a transistor. As such, maintaining the appropriate charge level that correctly represents the bits programmed into the cell is a constant challenge. If the charge level changes after programming to a charge level that represents a different bit value, an error may be introduced. Certain operations of the memory device may increase the charge level of a memory cell. For example, read-disturb errors may increase the charge level in a memory cell from the application of a Vpass voltage during a read operation to non-selected wordlines. The higher the Vpass voltage, the higher the likelihood of introducing errors. Additionally, charge levels stored in memory cells may decrease over time through a phenomenon known as charge loss. Both read-disturb and charge loss may change the value stored in the memory cell by changing the voltage level in the cell to a voltage level that does not correspond to the value that was programmed into the cell.

BRIEF DESCRIPTION OF THE DRAWINGS

In the drawings, which are not necessarily drawn to scale, like numerals can describe similar components in different views. Like numerals having different letter suffixes can represent different instances of similar components.

The drawings illustrate generally, by way of example, but not by way of limitation, various embodiments discussed in the present document.

DETAILED DESCRIPTION

Figure 1:
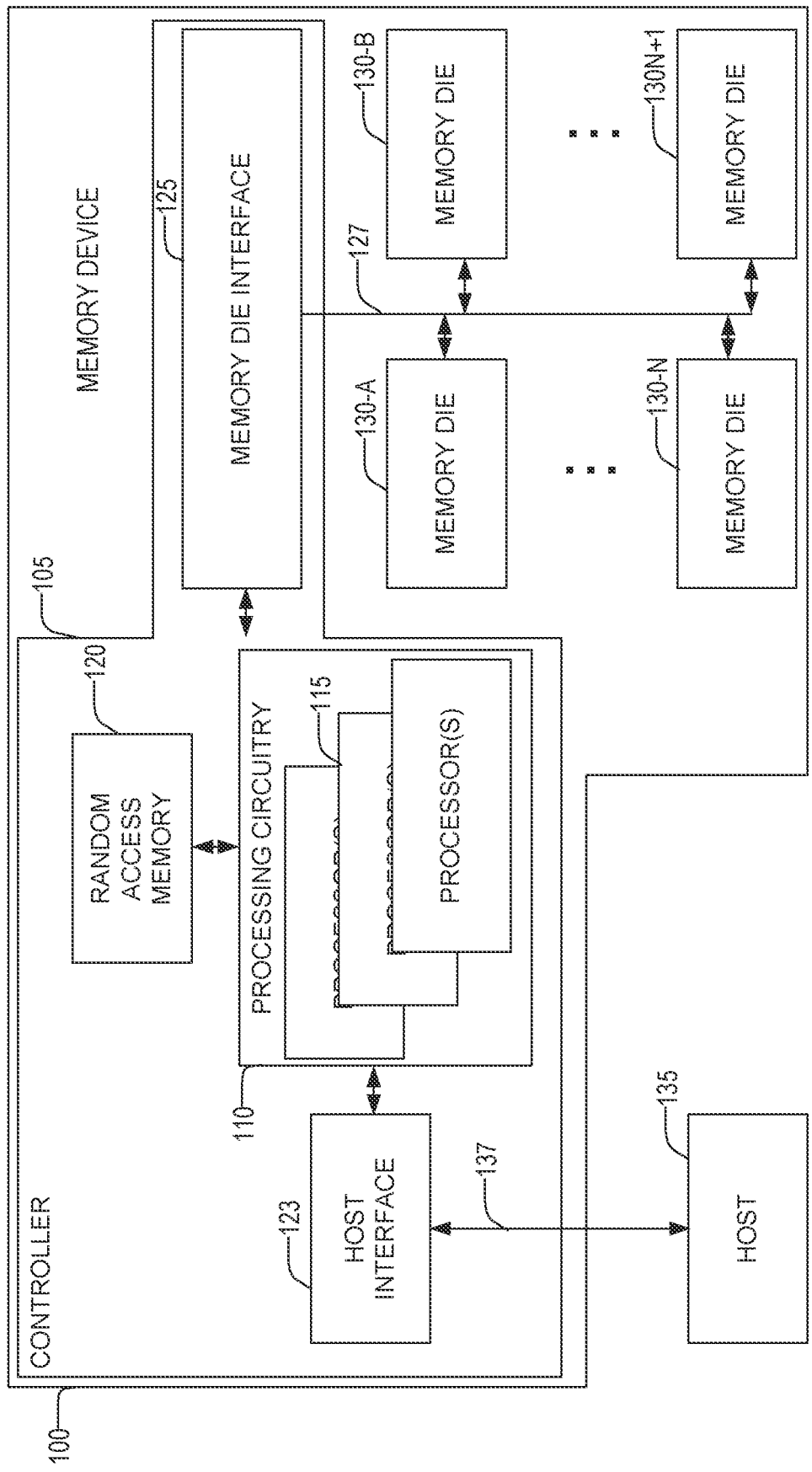
FIG. 1 illustrates a diagram of a memory device, such as a storage device according to some examples of the present disclosure.

Disclosed in some examples are methods, systems, devices, and machine-readable mediums that compensate for charge loss effects as well as reduce read-disturb effects by utilizing a charge loss estimation process to adjust read parameters of the memory device. In some examples, a charge loss of a unit (e.g., a page, a block, a plane, a die, or the like) of memory of the memory device may be estimated and utilized to select a charge loss compensation scheme that may include one or more parameters for performing reads of data in that particular unit of the memory device. Example parameters include a Vpass voltage, one or more read voltage levels, and the like. By adjusting the read voltage levels, the memory device may reduce read errors by more accurately aligning the read voltage levels to adjust for the decreased charge in the cells. The charge loss compensation scheme, in addition to reducing charge loss errors through adjustments to read voltages, may also reduce the Vpass voltage and therefore reduce read-disturb. This is because the Vpass voltage is based upon a highest voltage that represents a stored value in the memory cells. If the memory cells have shifted to lower voltages as a result of charge loss, the Vpass voltage may be reduced, which may reduce read-disturb errors.

Memory Device Overview

As previously noted, flash memory is utilized as non-volatile memory for a wide range of electronic applications. Flash memory typically includes one or more groups of transistors such as floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line and a source-side select gate (SGS) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the bit line to the source line through each series coupled group, restricted only by the selected memory cells of each group, placing current encoded data values of selected memory cells on the bit lines.

Flash memory cells in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) can extend adjacent a string of storage cells to form a channel for the storage cells of the string. In the example of a vertical string, the polysilicon structure can be in the form of a vertically extending pillar. In some examples the string can be "folded," and thus arranged relative to a U-shaped pillar. In other examples, multiple vertical structures can be stacked upon one another to form stacked arrays of storage cell strings.

Memory arrays or devices can be combined together to form a storage volume of a memory system, such as a solid-state drive (SSD), or one of various forms of managed memory device. Managed memory devices may be configured and operated in accordance with recognized industry standards. For example, managed NAND devices may be (as non-limiting examples), a Universal Flash Storage (UFS™) device, oran embedded MMC device (eMMC™), etc. For example, in the case of the above examples, UFS devices may be configured in accordance with Joint Electron Device Engineering Council (JEDEC) standards such as JEDEC standard JESD223D, entitled "JEDEC UFS Flash Storage 3.0," and/or updates or subsequent versions to such standard. Similarly, identified eMMC devices may be configured in accordance with JEDEC standard JESD84-A51, entitled "JEDEC eMMC standard 5.1", again, and/or updates or subsequent versions to such standard.

An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

Memory devices include individual memory die, which may, for example, include including a storage region comprising one or more arrays of memory cells, implementing one (or more) selected storage technologies. Such memory die will often include support circuitry for operating the memory array(s). Other examples, sometimes known generally as "managed memory devices," include assemblies of one or more memory die associated with controller functionality configured to control operation of the one or more memory die. Such controller functionality can simplify interoperability with an external device, such as a "host" as discussed later herein. In such managed memory devices, the controller functionality may be implemented on one or more die also incorporating a memory array, or on a separate die). In other examples, one or more memory devices may be combined with controller functionality to form a solid-stage drive (SSD) storage volume. The term "memory system," is used herein as inclusive of one or more memory die, and any controller functionality for such memory die, when present; and thus, includes individual memory devices, managed memory devices, and SSDs.

For purposes of the present description, example embodiments include managed memory devices implementing NAND flash memory cells, termed "managed NAND" devices. Such managed NAND devices may be constructed and operated generally in accordance with the described JEDEC UFS Flash Storage 3.0 specification, as may be modified as appropriate to incorporate the structures and functionality described herein. However, the described functionality may be implemented with other types of memory devices, as described above, which may incorporate other storage technologies, a few non-limiting examples of which were discussed earlier herein; and may be configured for operation in accordance with other industry standards, as discussed above; or in accordance with non-industry standard protocols.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates a diagram of a memory device 100, such as a storage device according to some examples of the present disclosure. Memory device 100 may include one or more host interfaces 123 which may utilize one or more protocols such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces to communicate with a host device 135. Host 135 may send one or more commands, such as read comments, write commands, erase commands, and the like to the memory device 100 through the host interface 123. Host interface 123 may be part of controller 105 or may be implemented by separate circuitry.

Memory device 100 may include one or more memory controllers 105. Controller 105 may include processing circuitry 110 which may include one or more hardware processors 115. Processors 115 may be general purpose hardware processors that execute firmware or other software instructions for performing operations of the memory device, including implementing the host interface 123 and memory die interface 125. In other examples, the processor(s) 115 may be special purpose hardware processors that are specifically designed to perform the operations of the memory device 100 through hardware logic and/or through the execution of software instructions. Processing circuitry 110 may also include logic circuits and other circuit components configured to perform various control functionality and memory management operations, or portions thereof, examples of which are described below.

In the depicted example, memory device 100 includes a host interface 123 providing communication through a host bus 137 to external host device 135. The configuration of host interface 123 may be of various forms depending upon the specific configuration of memory device 100 (which may also be termed a "memory system"). For example, in an example in which memory device 100 is a UFS device, the host interface will be in accordance with the applicable UFS standard.

Memory device 100 also incorporates one or more memory die interfaces 125 between the processing circuitry 110 of the controller 105 and at least some portion of the memory dies 130-A-130N+1 within memory device 100. Memory die interface 125 may be part of controller 105 or may be implemented by separate circuitry. For example, in the example of a UFS device, one or more of the memory die interfaces 125 will be a suitable memory interface, for example an Open NAND Flash Interface ("ONFI"), such as that defined by the ONFI 4.0 Specification, or later versions or revisions thereof.

Components of the memory device 100, such as controller 105, may include a random-access memory 120 for performing the operations of the memory device 100. The random-access memory 120 may be separate from the controller 105 or, as shown, may be integrated in the controller 105.

Figure 4:
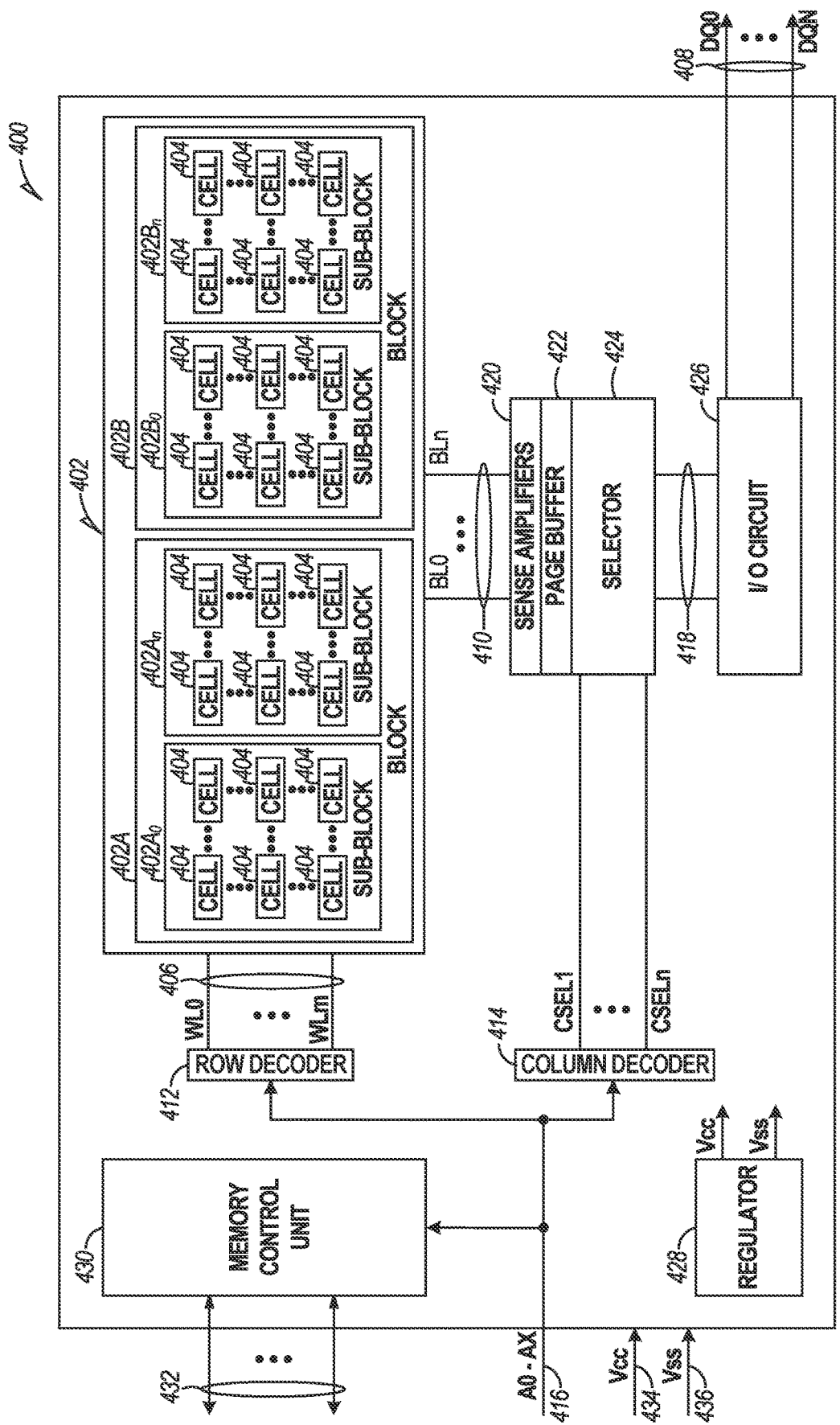
FIG. 4 illustrates an example block diagram of a memory die according to some examples of the present disclosure.

Controller 105 may handle one or more functions of the memory by interacting with the memory cells of the memory device that are part of one or more memory dies 130-A-130N+1. A schematic of an example implementation of a memory die 130 is shown in FIG. 4. The controller 105 may communicate with these memory dies through the memory die interface 125 across a memory die bus 127. In some examples, the memory dies may have their own device controllers, including processing circuitry and processors, to control operations on the respective memory die. Such device controllers may be formed on a common die with the device storage array or may be on a separate die from that containing the device storage array. Both configurations are embraced by the identified "memory die" (130A-N+1) described herein. Memory dies may be NAND dies, three-dimensional NAND dies, phase change memory dies, and the like.

The host device 135 may be a personal computer, a smartphone, a tablet, a portion of an integrated circuit, an Internet of Things (IoT) device (e.g., a refrigerator or other appliance, sensor, motor or actuator, mobile communication device, automobile, drone, etc.), or the like.

For purposes of the present description example memory operation and management functions may be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions.

The memory dies 130-A-130-N+1 can include several memory cells arranged in, for example, a number of planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the memory device 100 in pages and erased in blocks. However, one or more memory operations (e.g., read, write, erase, etc.) can be performed on larger or smaller groups of memory cells, as desired. The data transfer size of a memory device 100 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells can provide for different page sizes or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher bit error rate than a corresponding single-level cell (SLC) NAND flash device. As such, the MLC device can require more metadata bytes for error data than the corresponding SLC device.

Figure 2:
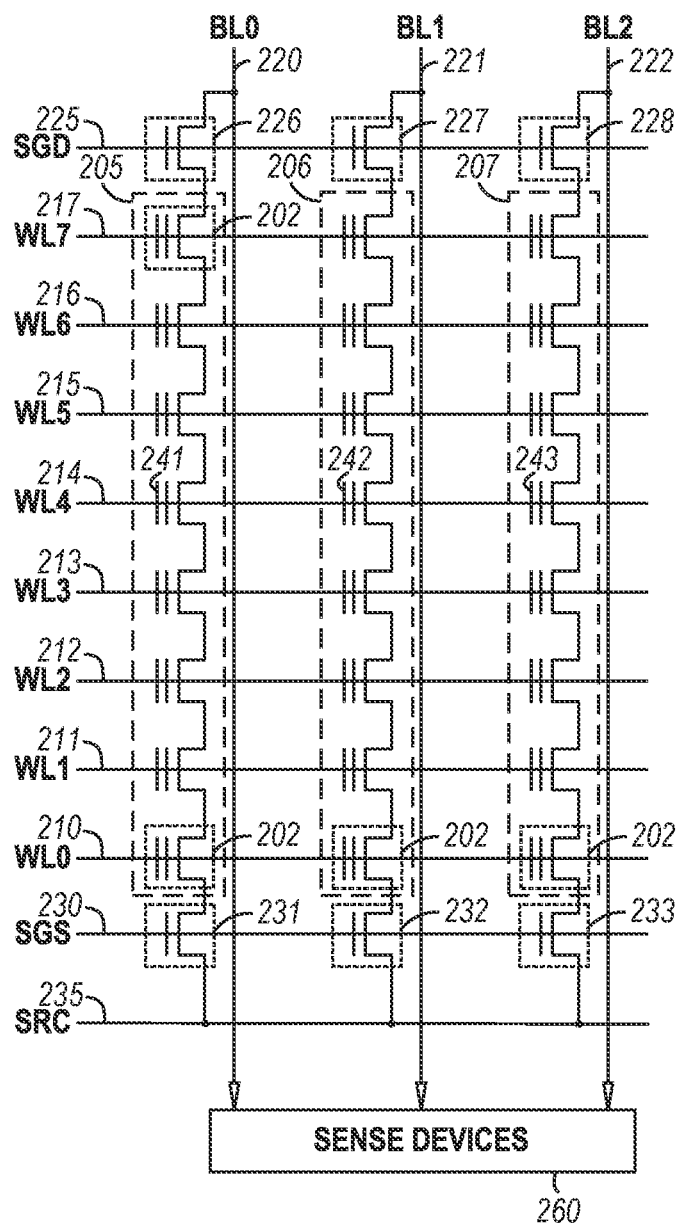
FIG. 2 illustrates an example schematic diagram of a portion of a NAND architecture semiconductor memory array according to some examples of the present disclosure.

FIG. 2 illustrates an example schematic diagram of a portion of a NAND architecture semiconductor memory array 300 including a plurality of memory cells 202 arranged in a two-dimensional array of strings (e.g., strings 205-207) and tiers (e.g., illustrated as respective word lines (WL) WL0-WL7 210-217, a drain-side select gate (SGD) line 225, a source-side select gate (SGS) line 230, etc.), and sense amplifiers or devices 260 according to some examples of the present disclosure. For example, the memory array 200 can illustrate an example schematic diagram of a portion of one physical page of memory cells of a memory die 130 from FIG. 1.

Each string of memory cells is coupled to a source line (SRC) 235 using a respective source-side select gate (SGS) (e.g., SGS 231-233), and to a respective data line (e.g., bit lines (BL) BL0-BL2 220-222) using a respective drain-side select gate (SGD) (e.g., SGDs 226-228). Although illustrated with 8 tiers (e.g., using word lines (WL) WL0-WL7 210-217) and three data lines (BL0-BL2 226-228) in the example of FIG. 2, other examples can include strings of memory cells having more or fewer tiers or data lines, as desired.

In a NAND architecture semiconductor memory array, such as the example memory array 200, the state of a selected memory cell 202 can be accessed by sensing a current or voltage variation associated with a particular data line containing the selected memory cell. The memory array 200 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., control gates (CGs) 241-243 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the charge storage structures of the targeted memory cells. Such charge storage structures may include, for example floating gates or charge trap regions of the respective memory cells. In floating gate memory cells charge is stored in an isolated polysilicon structure; while in charge trap memory cells the charge is typically stored in a dielectric structure.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the charge storage structures of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 260, coupled to one or more of the data lines (e.g., first, second, or third bit lines (BL0-BL2) 220-222), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

For Single Level Cells (SLC), there are two possible voltage levels programmed into the cell, one voltage level represents a binary '1' and another voltage level represents a binary '0' For Multi-Level Cells (MLC), there are four possible voltage levels programmed into the cell. The four possible voltage levels represent '00', '01', '10', and '11'. To program an MLC cell, multiple programming pulses are applied. A first pulse programs a first "page" of data that represents either the most significant bit or least significant bit of the cell. A second pulse programs the second "page" of data that represents the other bit of the cell that was not programmed by the first pulse. Similarly, Triple Level Cells (TLC) store eight possible voltage levels and Quad Level Cells (QLCs) store 16 possible voltage levels.

To read a value stored in one or more memory cells, a read voltage is applied to the wordline of the selected cells. A different voltage is passed to the sense amplifier depending on whether the voltage stored in the cells is less than or greater than the read voltage. For an SLC cell, the read voltage is selected to be between the two voltages representing a '1' and a '0.' For MLC, TLC, and QLC, multiple read operations are used to read each bit stored in the cell—each read operation utilizes a different read voltage.

To erase a memory cell or a group of memory cells (e.g., erasure is typically performed in blocks or sub-blocks), an erase voltage (Vers) can be applied to the substrates (and thus the channels, between the sources and drains) of the memory cells targeted for erase (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the charge storage structures of the targeted memory cells to the channels.

Figure 3:
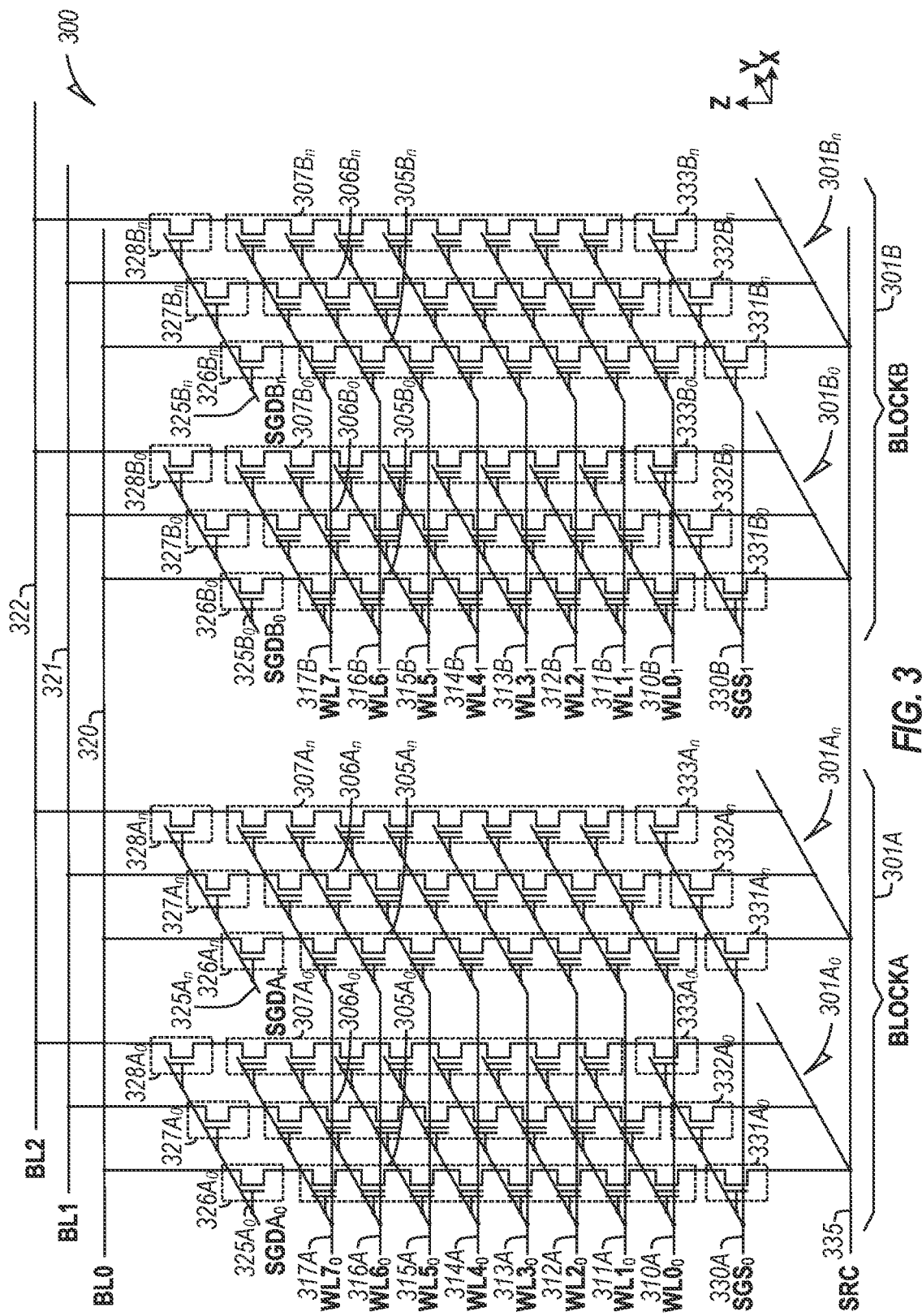
FIG. 3 illustrates an example schematic diagram of a 3D NAND architecture semiconductor memory according to some examples of the present disclosure.

FIG. 3 illustrates an example schematic diagram of a 3D NAND architecture semiconductor memory array 300 including a number of strings of memory cells (e.g., $A_0$ memory strings 305$A_0$-307$A_0$, $A_n$ memory strings 305$A_n$-307$A_n$, $B_0$ memory strings 305$B_0$-307$B_0$, $B_n$ memory strings 305$B_n$-307$B_n$, etc.), organized in blocks (e.g., block A 301A, block B 301B, etc.) and sub-blocks (e.g., sub-block $A_0$ 301$A_0$, sub-block $A_n$ 301$A_n$, sub-block $B_0$ 301$B_0$, sub-block $B_n$ 301B, etc.). The memory array 300 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 335 or a source-side select gate (SGS) (e.g., $A_0$ SGS 331$A_0$-333$A_0$, $A_n$ SGS 331$A_n$-333$A_n$, $B_0$ SGS 331$B_0$-333$B_0$, $B_0$ SGS 231$B_n$-233$B_n$, etc.) and a drain-side select gate (SGD) (e.g., $A_0$ SGD 326$A_0$-328$A_0$, $A_n$ SGD 326$A_n$-328$A_n$, $B_0$ SGD 326$B_0$-328$B_0$, $B_n$ SGD 326$B_n$-328$B_n$, etc.). Each string of memory cells in the 3D memory array can be arranged along the X direction as data lines (e.g., bit lines (BL) BL0-BL2 320-322), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 300 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 300 includes a control gate (CG) coupled to (e.g., electrically or otherwise operatively connected to) an access line (e.g., word lines (WL) $WL0_0$-$WL7_0$ 310A-317A, $WL0_1$-$WL7_1$ 310B-317B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, $A_0$ SGD 326$A_0$-328$A_0$ can be accessed using an $A_0$ SGD line SGDA$_0$ 325$A_0$, $A_n$ SGD 326$A_n$-328$A_n$ can be accessed using an SGD line SGDA$_n$ 325$A_n$, $B_0$ SGD 326$B_0$-328$B_0$ can be accessed using an $B_0$ SGD line SGDB$_0$ 325$B_0$, and $B_n$ SGD 326$B_n$-328$B_n$ can be accessed using an $B_n$ SGD line SGDB$_n$ 325$B_n$. $A_0$ SGS 331$A_0$-333$A_0$ and $A_n$ SGS 331$A_n$-333$A_n$ can be accessed using a gate select line SGS$_0$ 330A, and $B_0$ SGS 331$B_0$-333$B_0$ and $B_n$ SGS 331$B_n$-333$B_n$ can be accessed using a gate select line SGS$_1$ 330B.

In an example, the memory array 300 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

FIG. 4 illustrates an example block diagram of a memory die 400 including a memory array 402 having a plurality of memory cells 404, and one or more circuits or components to provide communication with, or perform one or more memory operations on, the memory array 402 according to some examples of the present disclosure. The memory die 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks $402A_0$, $402A_n$, and the second block 402B can include first and second sub-blocks $402B_0$, $402B_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals and/or instructions/commands received on control lines 432 at a memory interface with a memory controller (as described relative to controller 105 and host interface 123 of memory device 100 of FIG. 1. Such signals and/or instructions may include, for example, one or more clock signals and/or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory die 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory die 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory die 400, such as a controller 105, can communicate with the memory die 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402 or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418. In some examples a flash translation layer (not shown) can map addresses provided by a host to physical memory addresses used by the row decoder 412 and column decoder 414 to read data in the memory array 402.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Charge Loss Compensation

As previously noted, charge loss may affect the charge stored on one or more memory cells and therefore affect the value read by the memory device. This charge loss may be compensated for by estimating the charge loss and using that estimate to select a charge loss compensation scheme.

In some examples, the charge loss may be estimated by a charge loss estimation process by determining a charge loss estimation read voltage; reading a page or other unit of the memory device by applying the charge loss estimation read voltage to the unit; and calculating a total bit count resulting from the read at the charge loss estimation read voltage. The bit count may be an estimation of the charge loss as it represents a number of bits counted at a particular charge loss estimation read voltage. That bit count will change over time. For example, if at time t1, 100 bits are expected to be read out of a page of data after application of the charge loss estimation read voltage, then at a later time t2, a different (e.g., fewer) number of bits may be read. The number of bits returned by this read may be used to select a charge loss compensation scheme that specifies one or more parameters such as Vpass and read voltage levels.

Calculating the charge loss and applying charge loss compensation for every read operation may be too computationally expensive and may result in undesirable wear to the memory device. Instead, in some examples, the charge loss estimation process may execute as a background task that may periodically sample various memory units (e.g., pages, blocks, planes, dies, and the like) and estimate a charge loss for those sampled units. The system may use the sampled units to estimate the charge loss for unsampled units. The background charge loss estimation process may execute with a defined periodicity, when the memory device is idle (or has been idle for a particular threshold period of time), on demand (e.g., when requested by the host), or the like.

The number of units sampled by the background task and which units to sample may be calculated or specified. For example, the number of units to sample may vary based upon the number of uncorrectable ECC errors experienced by one or more units of the memory device, an age of one or more units of the memory device, an age of data written to the one or more units of the memory device, and the like. For example, as the memory device experiences more ECC errors, that suggests that charge loss may be greater than estimated and so the memory device may sample additional units to calibrate itself better. Additionally, as the age of the particular unit of memory increases, a charge loss may accelerate as the unit may not hold charge as well. Furthermore, as the age of the data written to a unit of the memory device increases, charge loss errors to that unit may be more likely. The sampled units may be changed overtime, such that two successive executions of the background process may not sample the same units. The units selected for sampling may be done based upon a schedule. In some examples, units experiencing errors above a threshold, units with an age of data programmed onto the unit that are greater than a threshold, units that are written as random-access data, or the like may be selected at a greater frequency.

As previously noted, the system may use the sampled units to estimate the charge loss for unsampled units. For example, unsampled units within a same level of a memory device hierarchy as a sampled unit may be assigned a same or similar charge loss estimation, or otherwise may have a charge loss estimated based upon the sampled units within that level of hierarchy. For example, a first page in a first block may be selected and may have an estimated charge loss of x. A second page in the same first block may be unselected. The system may estimate the charge loss of the second page based upon the estimated charge loss of the first page. In some examples, the second page may have an estimated charge loss of x or an estimated charge loss that is different than x but based upon x—e.g., using x in a formula.

In examples in which multiple samples are taken for a particular memory device unit (e.g., multiple pages in a block), the memory device may use all of the samples (e.g., an average) to calculate the estimated charge loss for the entire unit. For example, an average of all the sampled charge losses in a block may be used to estimate the charge loss for all pages within the block. In yet other examples, each sampled unit may be weighted in a formula to calculate an estimate of the charge loss. The weighting may be based according to one or more of: a physical proximity, a temporal proximity, an access type, and/or the like.

In other examples, a non-selected unit may be estimated using some, but not all the selected units. Which selected units are used for estimating the charge loss for a given un-selected unit may depend on a physical proximity to the unselected unit (e.g., one or more selected units physically proximate to the unselected units may be used), a temporal proximity to the unselected unit (e.g., one or more selected units that were written closest in time to the unselected unit), an access type match to the unselected unit (e.g., random access or sequential access), and the like. In some examples, the selected units that are used for estimating the charge loss for a given un-selected unity may be weighted in a formula to calculate an estimate of the charge loss. The weighting may be based according to one or more of a: physical proximity, a temporal proximity, an access type, and/or the like.

The estimated charge loss may then be used to select a charge loss compensation scheme. For example, a parameter may be calculated by a formula that has, as an input, the estimated charge loss. In other examples, the estimated charge loss, as represented by the bit count returned by the charge loss estimation process may be used as a key in a lookup table. That is, the lookup table may specify ranges of returned bits (e.g., a minimum and maximum) and a corresponding charge loss compensation scheme for that range. If the returned bits fall within a particular range specified by a particular charge loss compensation scheme, the system selects that particular charge loss compensation scheme.

In some examples, the charge loss compensation scheme as estimated by the background process (for both unselected and selected memory cells of the background charge loss estimation process) may be applied for all read requests. In other examples, the charge loss compensation scheme may be applied for read requests that first experience errors using read parameters that were not compensated for charge loss. In still other examples, the charge loss compensation scheme determined by the background process may only apply to specially designated reads.

In some examples, a controller of the memory device may determine that one or more reads are more likely to have a charge loss condition or may contain more important data where minimizing errors may be more important than speed. To handle this situation, the controller of the memory device may specifically execute a special charge loss compensation (CLC) read on the particular unit of data. This CLC read may first attempt to read the unit of data using the charge loss compensation scheme estimated based upon the background process. In some examples, if an Error Correction Code limit is exceeded for this CLC read (e.g., the number of uncorrectable ECC errors exceeds a threshold), then the charge loss estimation process determines an updated charge loss compensation scheme for the particular pages that are being read rather than use the CLC scheme estimated as a result of the sampled data units in the background process. This results in a more accurate CLC estimation. The memory device re-reads the unit of data using the parameters in the updated charge loss compensation scheme.

By the combined use of background operations and on-demand operations for sensitive or at-risk data, the system may minimize both charge loss effects and read disturb errors by adjusting both the read voltages and the Vpass voltages. This is done without introducing significant delay on most read operations while also limiting the wear on the NAND device. For data that is at-risk or sensitive, the system may utilize more intensive operations that may still produce a faster read when considering the error handling that may be avoided by updating the read operations for charge loss effects.

Figure 5:
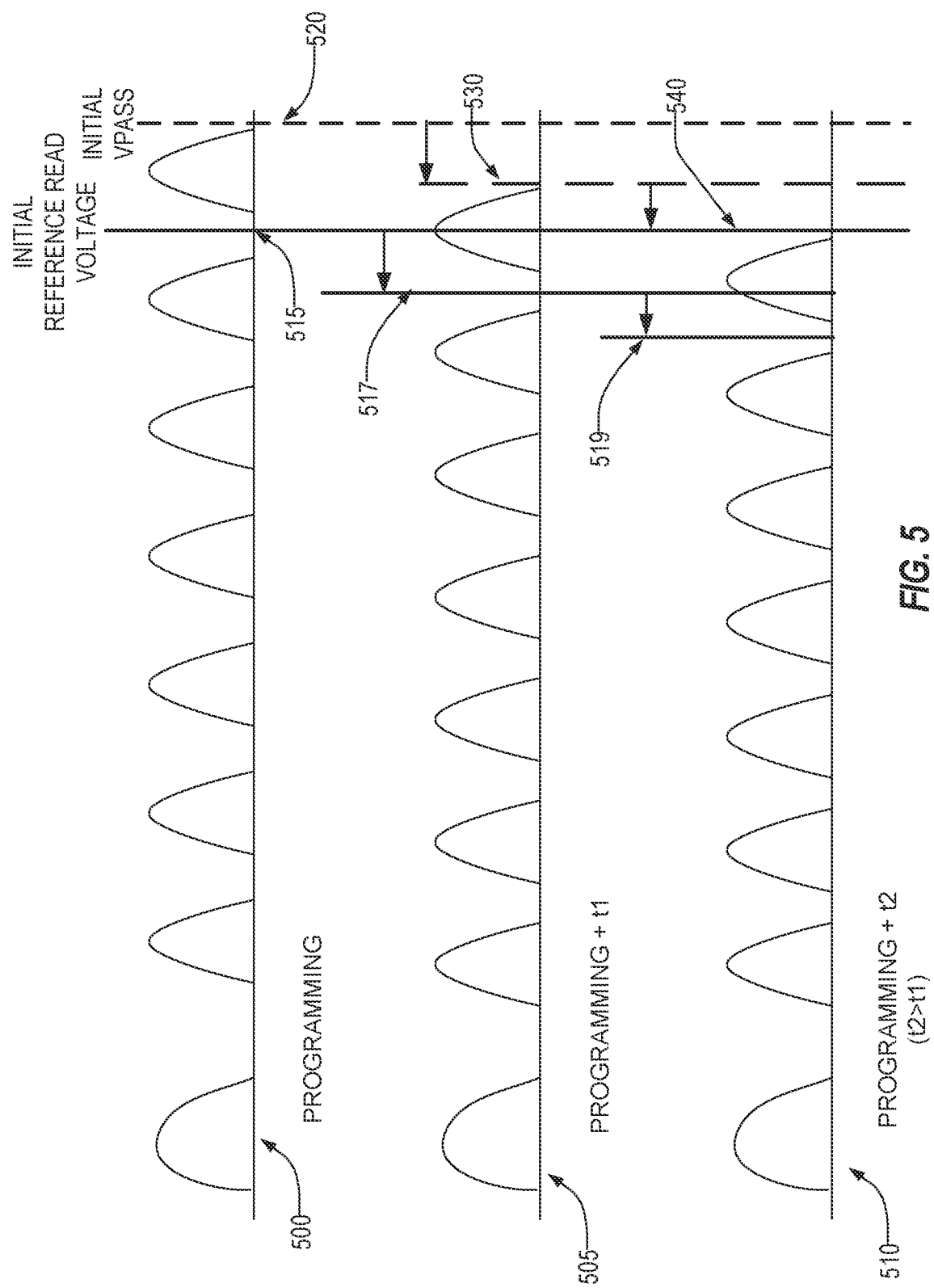
FIG. 5 illustrates a charge loss effect according to some examples of the present disclosure.

FIG. 5 illustrates a charge loss effect according to some examples of the present disclosure. Charge distribution plot 500 shows various example charge distributions for each of eight possible states of a TLC memory cell just after programming. Each parabola shows an expected charge distribution for each potential value of a TLC memory cell. For example, the leftmost parabola may represent expected charge levels for a bit value of '111' in some examples. Other parabolas represent other potential bit values. The charge distribution represents the expected probabilities of each charge level for a given bit value.

Charge distribution plots 505 and 510 show the effects of time on the charge distributions from charge distribution plot 500. Charge distribution plots 505 shows that after a period of time t1 has elapsed since programming, the charge distributions shift as a result of charge loss. An example reference read voltage 515, when used with charge distributions in charge distribution plot 500, properly aligns between the last two charge distributions and would be useful in distinguishing between those corresponding bit values. However, at charge distribution plots 505, the reference read voltage 515 is now in the middle of the last distribution. In these examples, whether the correct value is read with this reference voltage depends on whether the actual charge stored in the cell falls on the right half or left half of the distribution.

Charge distribution plot 510 shows expected charge distributions after a period of time t2 from programming (where t2 is greater than t1). In this charge distribution plot, all the charge distributions have shifted leftward enough that the reference read voltage 515 is likely to produce an incorrect result for most reads.

To prevent read errors, memory devices need to account for charge loss. For example, by shifting the reference read voltages depending on the amount of charge lost. At time t1 after programming, the reference read voltage may be shifted from 515 to 517 and at time t2 after programming, the reference read voltage may be shifted even further to 519. The amount to shift the read voltage may be determined using a charge loss compensation scheme.

Additionally, a Vpass voltage may also be adjusted. As previously described, the Vpass voltage is selected to be a voltage level higher than a voltage of the greatest distribution stored in the cell to guarantee that the cell passes a charge and to avoid a charge stored in a non-selected wordline from interfering with the read operation of the selected wordline. Vpass voltage however is not without its undesirable effects. For example, non-selected wordlines may gain charge after repeated applications of Vpass voltage. To reduce these effects, as a particular memory cell loses charge, it becomes possible to take advantage of the charge loss by reducing the Vpass voltage to reduce unwanted read-disturb effects. For example, at time t1 after programming, the Vpass that was initially at line 520 may be a reduced Vpass at line 530. At time t2 after programming, the Vpass may move even further to 540.

In order to accurately set both the various read voltages and the Vpass voltages, the memory device needs to have an accurate way of measuring charge loss. In some examples, a charge loss estimation process executed by the memory device may estimate charge loss by reading a page or other unit of memory at a charge loss estimation read voltage. In some examples, the charge loss estimation read voltage may be a read voltage that is estimated to be between a highest and second highest voltage distribution at the time of programming. In other examples, the charge loss estimation read voltage may be set to other values (e.g., between other distributions, or even within a distribution). This voltage may be a prespecified voltage or may be calculated on the fly. The number of bits read at that voltage may be used to determine the charge loss compensation scheme. For example, a table may have rows of charge compensation schemes with associated upper- and lower-bit count ranges. The charge loss compensation scheme may specify modifications to one or more parameters of the memory device such as Vpass and/or various read voltages.

As previously described, while performing a charge loss compensation process may reduce an error rate and reduce read-disturb effects, these processes may be computationally expensive when applied to each read of the memory. Instead of applying this process to all reads, in some examples, the memory device may estimate charge loss in a background operation. For example, when the memory device is idle (or has been idle for a particular period of time), the memory device may read the contents of a unit of memory comprising a memory cell or a group of memory cells (e.g., a page, block, and the like) and may calculate a charge loss compensation scheme for that unit. As noted earlier herein, charge loss compensation scheme may be implemented in various forms such as being applicable to only those memory cells for which the charge loss compensation was estimated during background scans, may apply to all memory cells within a particular same hierarchical level of memory cells as the selected memory cells (e.g., every page within a same block, all the blocks within a same superblock), or other physical and/or temporal allocations, as desired.

In some examples, and as previously noted, the charge compensation scheme may be estimated for non-sampled memory cells based upon the charge compensation estimate of the sampled memory cells. In some examples, data that is written at a point in time that is similar to that of the sampled memory cells may have similar charge loss and may be adjusted similarly. For example, memory cells that are written within a threshold time of a sampled memory cell may have a same charge loss compensation scheme applied as the sampled memory cell.

Figure 6:
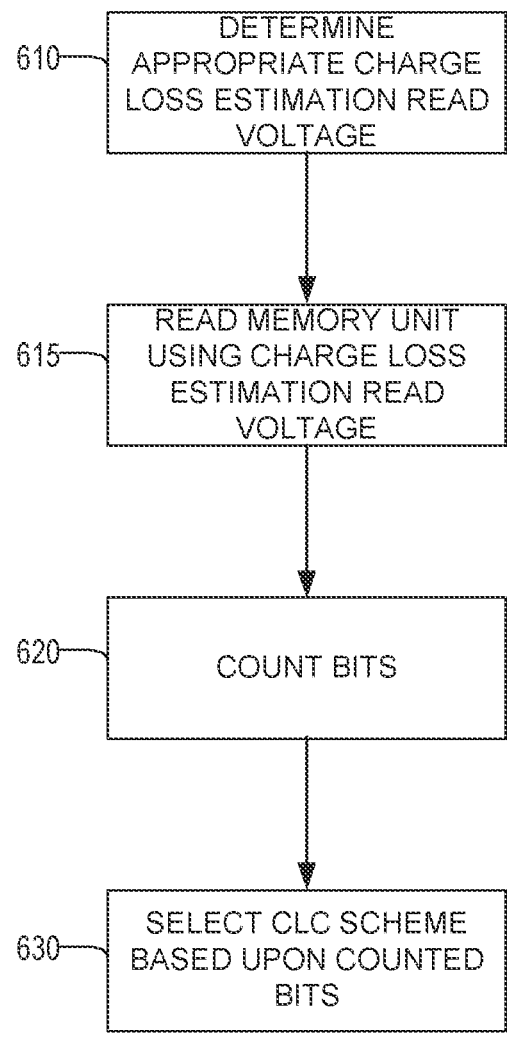
FIG. 6 illustrates a flowchart of a method of charge loss estimation according to some examples of the present disclosure.

FIG. 6 illustrates a flowchart of a method 600 of charge loss estimation according to some examples of the present disclosure. At operation 610, the controller may determine the appropriate charge loss estimation read voltage. For example, a charge loss estimation read voltage may be specified that allows the system to track charge loss over time. For example, reading all cells of a given page, block, or die with the reference read voltage 515 of FIG. 5 would return a number of stored bits that have voltage levels above the charge loss estimation read voltage level for the time right after programming, a smaller number of bits at time programming+t1, and an even smaller number of bits at time programming+t2. In some examples, the charge loss estimation read voltage may be a prespecified value that may be an approximation of a read voltage between the two highest expected voltage distributions in the memory cells.

At operation 615, the controller may cause the memory cells making up a unit of memory (e.g., a page, a block, a die, a superblock) to be read at the read voltage determined at operation 610. At operation 620, the memory device may count the number of bits read at this voltage. At operation 630, the memory device may select a charge loss compensation scheme based upon the number of bits counted at operation 620. For example, a table may correlate a number of bits to particular charge loss compensation scheme. For example:

| BITS | RETRY | VPASS ADJUSTMENT |
|---|---|---|
| 0-100 | RR7 | −600 mv |
| 101-1000 | RR6 | −400 mv |
| 1001-10000 | RR5 | −200 mv |
| 10001-16000 | RR4 | N/A |

In some examples, the number of bits and the corresponding read-retry level may be a statistical approximation. For example, after programming, the number of bits above the reference read level (which may be a read level between the last two distributions) may be approximately $\frac{1}{8}^{th}$ of the number of bits in a 16 KB page for a TLC page. This is because there are 8 distributions in a TLC cell and when the data is randomized across the entire 16 KB page, each distribution will have approximately the same number of bits—or $\frac{1}{8}^{th}$. The number of bits in a 16 KB page is 16*1024*8 bits=131,072 bits. Since it is likely over that many bits that each bit is represented equally, 131,072 divided by 8, equals 16,384. As time passes after programming, more and more bits shift lower—e.g., fewer bits are above the reference read threshold (which, in some examples, is between the last two distributions).

The bit count of the given page, block, or die may be used as an index to select a row of the table with device parameters. "Retry"—which may specify one or more reference read voltage levels for either the initial read, or a retry read; and a VPass adjustment value. The table may be such that between 0 bits and 100 bits, the retry parameter is RR7 and the VPass value reduced by 600 mv; between 101-1000 bits, the retry parameter is RR6 and the VPass value is calculated by subtracting 400 mv from a reference or default VPass value; between 1001 and 10000 the retry parameter is RR5 and the VPass is calculated by subtracting 200 mv from a reference or default VPass value; between 10001 and 16000 bits, the retry value is RR4 and the VPass is a reference or default VPass value. One of ordinary skill in the art with the benefit of the present disclosure will appreciate that the table above is exemplary and other ranges and other values may be utilized.

In other examples, rather than being ranges, one or more of the parameters may be determined based upon a function of the number of bits that are counted or a difference between the number of bits counted an expected number of bits. The function may be linear, quadratic, or the like and may output a charge loss compensation scheme parameter based upon the input number of bits.

As previously noted, the method 600 may be performed as a background process that may sample one or more data units such as a page, block, die, or the like. The number of bits read after applying the charge loss estimation read voltage to each sample may be used to set a charge loss compensation scheme for the sampled data units. The sampled data units may be used to set a charge loss compensation scheme for unsampled data units. For example, by estimating a charge loss compensation scheme for a particular unsampled unit from the estimation of the charge loss of a sampled unit. The estimation may factor in a physical distance between the unsampled unit and a sampled unit, a correspondence between when the sampled unit was written and when the unsampled unit was written, and/or the like. For example, a Vpass reduction may be a linear function of both the time difference between when a sampled data unit was written and when an unsampled data unit was written and the bit count of the sampled data unit. Thus, the closer the sampled and unsampled units are in time, the closer the charge loss estimations of the sampled unit will be to the unsampled unit.

In some examples, the charge loss compensation scheme selected for a particular page as a result of the background process may be applied to every read. In other examples, the charge loss compensation scheme selected for a particular page as a result of the background process may be applied only when a normal read of that page results in an error. In still other examples, the charge loss compensation scheme selected for a particular page as a result of the background process may be applied when executing a special inline charge loss compensation read command. For example, a page may store data that may be sensitive data that needs to be read correctly or may be determined by the controller to be more prone to charge loss effects. In these examples, the inline charge loss compensation read may first apply the charge loss compensation scheme estimated using the background process. If the page is not correctly read (e.g., does not pass ECC checks), then the charge loss estimation process may be specifically applied for that particular unit of data (e.g., page) that is being read. The updated charge loss estimation is used to determine an updated charge loss compensation scheme, which is then used when retrying the read operation.

Figure 7:
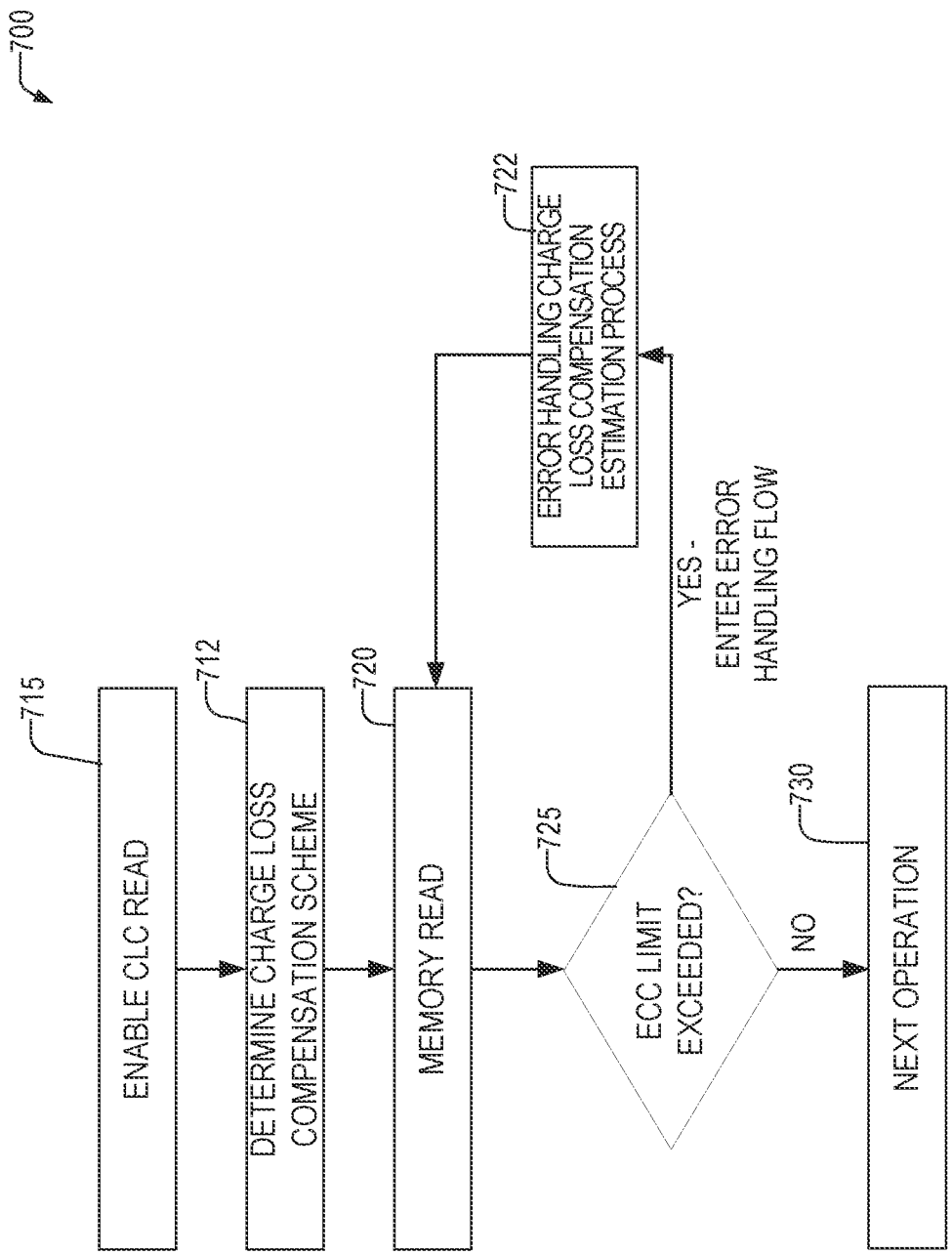
FIG. 7 illustrates a flowchart of a method for an inline charge loss compensation read command according to some examples of the present disclosure.

FIG. 7 illustrates a flowchart of a method 700 for an inline charge loss compensation read command according to some examples of the present disclosure. The inline charge loss compensation (CLC) read may begin at operation 715 where the controller enables a CLC read. The controller may enable a CLC read on a unit of data based upon a command from a host device, as a result of errors previously reading the unit of data (e.g., a number of errors exceeding a threshold), a determination that the data is likely to be affected by charge loss, the data is important data, or the like. The controller may determine that the data is likely affected by charge loss in a variety of ways. For example, if the data is random access data, if the age of the data stored in a page is past a threshold age, and/or the like.

Once the controller determines that a CLC read is to be executed at operation 715, flow proceeds to operation 712 in which the charge loss compensation scheme is determined. For example, the background process may have estimated the charge loss of one or more selected data units. If the CLC read request is not requesting to read one of the selected data units, the charge loss compensation scheme may be estimated for the data units requested to be read by the CLC read request based upon the selected data units. This estimation may be done when the background charge loss estimation (e.g., FIG. 6) is performed and stored (in which case operation 712 reads this estimation out of storage) or may be done at operation 712.

At operation 720, the controller than causes a read operation to be executed using the parameters of the charge loss compensation scheme determined at operation 712. For example, using a reference read voltage, a Vpass voltage adjustment, and the like.

At operation 725, a check is made to determine if the read resulted in ECC errors that exceed a threshold. That is, whether the ECC produced uncorrectable errors (e.g., too many bit errors). If not, then at operation 730, the system proceeds to a next operation (e.g., a next read operation). Otherwise, an error handling flow may be started by executing an error handling charge loss estimation process 722. An example error handling charge loss estimation process 722 is shown in FIG. 6. An error handling charge loss estimation process 722 may be a same process as the charge loss estimation process 712, except that the error handling charge loss estimation process 722 may be executed on the actual unit of data that is subject of the CLC read request, rather than using an estimate based upon a different unit of data (as in the background process). Once the charge loss estimation process 712 completes, a read is tried again at operation 720 using the updated charge loss compensation scheme determined from the charge loss estimation process 712.

As previously described, the read at operation 720 first used the value of the unit of data estimated by the background CLC estimation process. If executing a read command with those parameters results in an ECC limit being exceeded, the specific charge loss value of the specific unit of data being read may be estimated and used to select a more refined charge loss compensation scheme. The read is then retried.

Throughout the various procedures described herein, charge loss for various data units are estimated and charge loss compensation parameters determined based upon those estimations. Whether through a background process or via a CLC read, the results of these operations (either the charge loss estimation or the charge loss compensation parameters) may be stored in the memory device for later usage. This storage may be in a register, a cache, a RAM, a working memory, or in the non-volatile memory (e.g., the NAND) itself.

Figure 8:
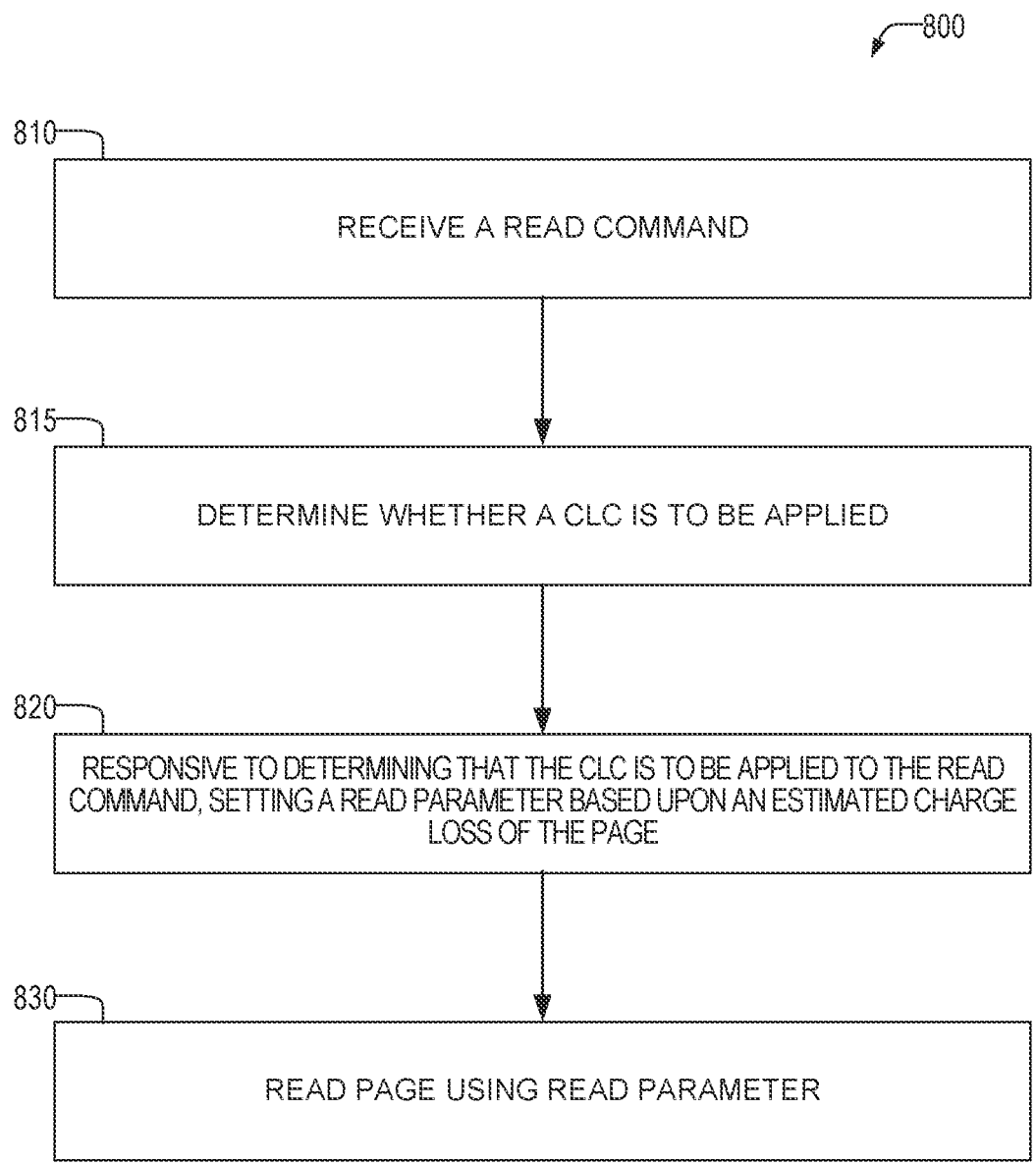
FIG. 8 illustrates a flowchart of a method of performing a read operation according to some examples of the present disclosure.

FIG. 8 illustrates a flowchart of a method 800 of performing a read operation according to some examples of the present disclosure. Method 800 is one example of methods 600 and 700 according to some examples. At operation 810, the memory device may receive a read command for a unit of data. For example, a read command for a page of data. At operation 815, the controller may determine whether to apply a CLC read. For example, the unit of data may be stored in a random access fashion (as opposed to sequentially) which may indicate a higher charge loss potential and thus may indicate that a CLC read should be performed. In other examples, a host may specify that the data is to be read using a CLC read.

If the CLC read operation is not performed, then the read may proceed as normal. If, on the other hand, the CLC read is to be applied, then at operation 820, the controller may set a read parameter based upon an estimated charge loss of the page (e.g., on a count or estimate of a number of bits in the page that are read after applying a reference read voltage level). Example read parameters may include a read-retry parameter (e.g., a voltage to use on a read-retry if needed), a Vpass voltage, a reference voltage, and the like. At operation 830, the controller may cause the data unit to be read using the read parameter chosen at operation 820. In some examples, at operation 820 the read parameter may be set using estimates of the charge loss of one or more selected data units.

Figure 9:
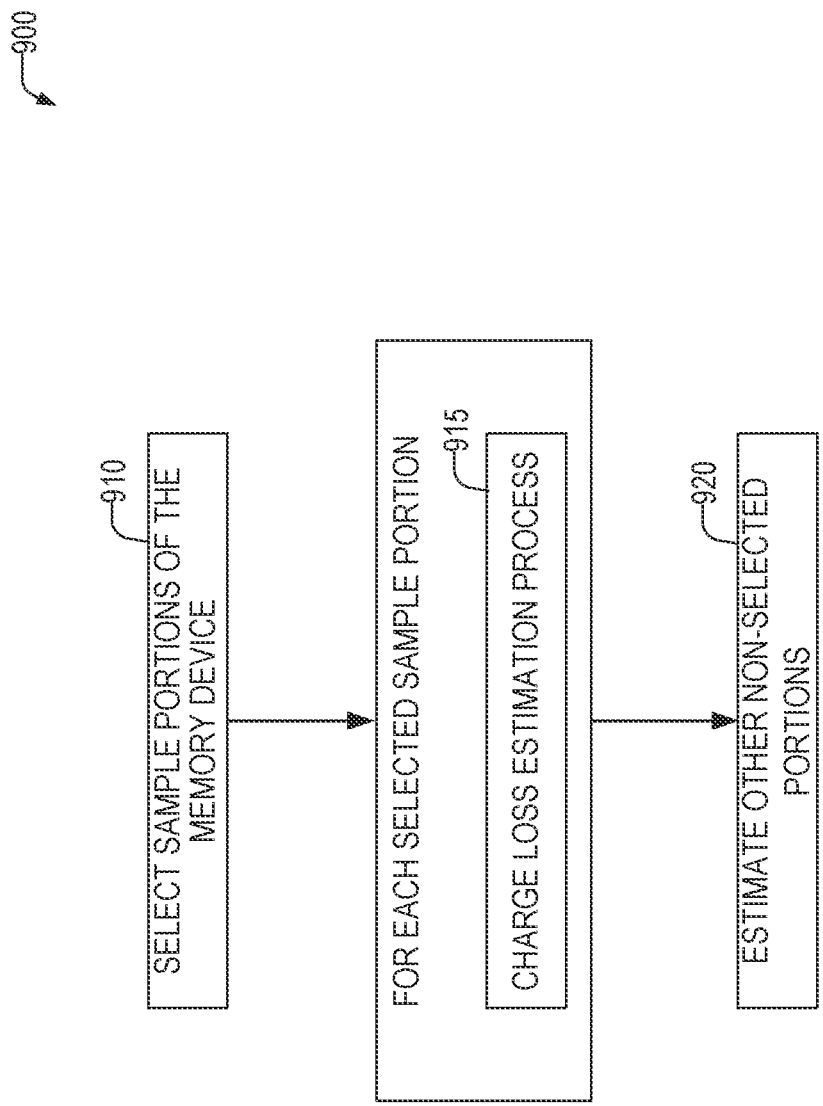
FIG. 9 illustrates a method of performing a background charge loss estimation process according to some examples of the present disclosure.

FIG. 9 illustrates a method 900 of performing a background charge loss estimation process according to some examples of the present disclosure. At operation 910, one or more sample portions of the memory device may be selected. For example, cells that are more likely to suffer from charge loss—such as random-access cells. In other examples, cells that have been programmed for a certain time. For example, cells may be selected that were written at a first time, a second time, a third time, and the like. In these examples, charge loss in non-selected cells may be estimated by using a selected cell that was written at a time closest to the non-selected cells. For example, if cells at times x, y, and z are selected for charge loss estimation during a background scan, a cell that was written at a time closer to x than y or z may use the charge loss estimation of one or more cells that were sampled that were written at time x to set or estimate charge loss.

At operation 915, for each sampled portion of the memory device, the charge loss estimation process of FIG. 6 may be performed to estimate the charge loss. The results of the charge loss estimation compensation process flow may be stored on the memory device in an area corresponding to or associated with the sampled portion or may be stored in a different area with an indication of which memory cells were sampled, or what their characteristics are. At operation 920, a charge loss compensation scheme for one or more other data portions that were not selected may be determined based upon the charge loss estimated from the selected portion. Operation 920 may be performed immediately after operation 915 or may be performed when a read request is handled for one of the non-selected portions. The read request may be a regular read request, a CLC read request, or a read-retry of a read request.

The charge loss estimate or charge loss compensation scheme that was determined using FIG. 9 may be used when a subsequent read is applied for one of the selected cells and/or unselected cells using an estimated CL based upon the selected cells. For example, the read may apply one or more parameters of the charge loss compensation scheme that was determined or estimated. In other examples, the CLC parameters may be applied as a read-retry option if the initial read fails.

Figure 10:
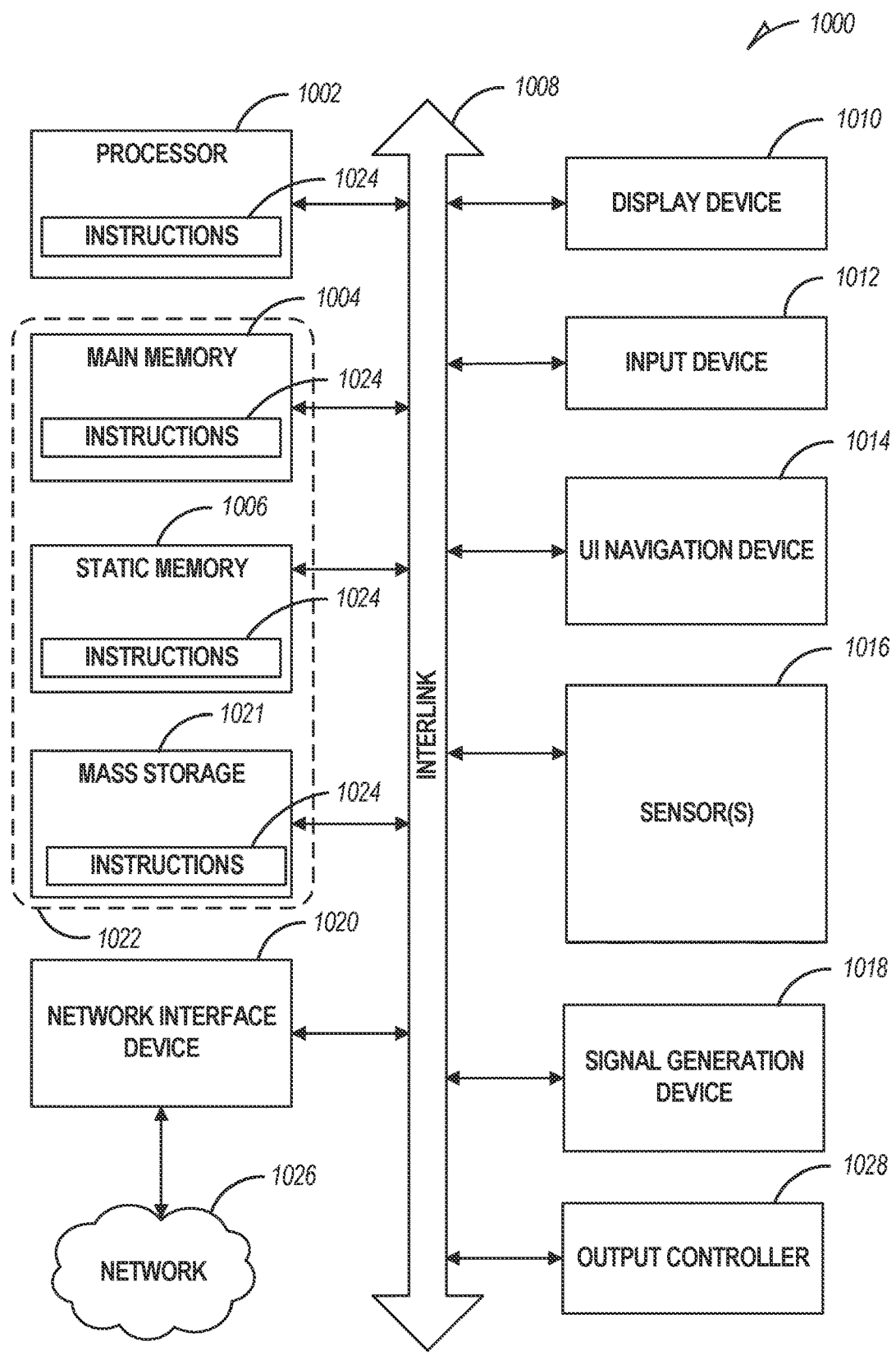
FIG. 10 illustrates a block diagram of an example machine upon which any one or more of the techniques (e.g., methodologies) discussed herein may be performed.

FIG. 10 illustrates a block diagram of an example machine 1000 upon which any one or more of the techniques (e.g., methodologies) discussed herein may be performed. For example, any of the described memory units of example machine 1000 (main memory 1004, static memory 1006, and/or mass storage 1021) may be implemented through memory implementing charge loss compensation functionality techniques such as those discussed relative to FIGS. 5-9 herein. In alternative embodiments, the machine 1000 can operate as a standalone device or can be connected (e.g., networked) to other machines. In a networked deployment, the machine 1000 can operate in the capacity of a server machine, a client machine, or both in server-client network environments. In an example, the machine 1000 can act as a peer machine in peer-to-peer (P2P) (or other distributed) network environment. The machine 1000 can be a personal computer (PC), a tablet PC, a set-top box (STB), a personal digital assistant (PDA), a mobile telephone, a web appliance, an IoT device, automotive system, a host device, or any machine capable of executing instructions (sequential or otherwise) that specify actions to be taken by that machine. Components of machine 1000 can be present in a memory device (e.g., a processor, main memory, mass storage and the like). Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, modules, mechanisms, or circuitry (hereinafter "circuitry"). Circuitry is a collection (e.g., set) of circuits implemented in tangible entities that include hardware (e.g., simple circuits, gates, logic, etc.). Circuitry membership can be flexible overtime and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the machine-readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The methods 600, 700, 800, and 900 may be implemented as software—e.g., as instructions stored on a machine-readable medium (e.g., memory die 130, 400, 1021). The instructions, when executed by one or more processors (e.g., 115, 430, 1002), cause the memory device to perform the methods 600, 700, 800, and 900.

The machine (e.g., computer system) 1000 (e.g., the host device 135, the memory device 110, etc.) can include a hardware processor 1002 (e.g., a central processing unit (CPU), a graphics processing unit (GPU), a hardware processor core, or any combination thereof). In some examples, processor 1002 may be the processing circuitry 110 (e.g., processors 115), memory control unit 430 and the like. Machine 1000 may include a main memory 1004 and a static memory 1006, some or all of which can communicate with each other via an interlink (e.g., bus) 1008. Main memory 1004 and/or static memory 1006 may be the random access memory 120. The machine 1000 can further include a display device 1010, an input device 1012 (e.g., a keyboard), and a user interface (UI) navigation device 1014 (e.g., a mouse). In an example, the display device 1010, input device 1012 and UI navigation device 1014 can be a touch screen display. The machine 1000 can additionally include a mass storage device (e.g., drive unit) 1021, a signal generation device 1018 (e.g., a speaker), a network interface device 1020, and one or more sensors 1016, such as a global positioning system (GPS) sensor, compass, accelerometer, or other sensor. The machine 1000 can include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). Portions of machine 1000 may be included in memory device 100 and portions of machine 1000 may be examples of components of memory device 100.

Mass storage device 1021 may be a memory device such as memory device 100 described in FIG. 1 or one or more memory dies 130, 400. The mass storage device 1021 can include a machine readable medium 1022 on which is stored one or more sets of data structures or instructions 1024 (e.g., software) embodying or utilized by any one or more of the techniques or functions described herein. The instructions 1024 can also reside, completely or at least partially, within the main memory 1004, within static memory 1006, or within the hardware processor 1002 during execution thereof by the machine 1000. In an example, one or any combination of the hardware processor 1002, the main memory 1004, the static memory 1006, or the mass storage device 1021 can constitute the machine readable medium 1022. Machine readable medium 1022 and the instructions 1024 may be stored on the memory device 100, memory dies 130, 400, random access memory 120 (which may be main memory 1004 or static memory 1006), processing circuitry 110, processors 115, and the like.

While the machine readable medium 1022 is illustrated as a single medium, the term "machine readable medium" can include a single medium or multiple media (e.g., a centralized or distributed database, or associated caches and servers) configured to store the one or more instructions 1024. The machine-readable medium may be a non-transitory machine readable medium.

The term "machine readable medium" can include any medium capable of storing, encoding, or carrying instructions for execution by the machine 1000 and that cause the machine 1000 to perform any one or more of the techniques of the present disclosure, or capable of storing, encoding or carrying data structures used by or associated with such instructions. Non-limiting machine-readable medium examples can include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1024 (e.g., software, programs, an operating system (OS), etc.) or other data are stored on the storage device 1021, can be accessed by the memory 1004 for use by the processor 1002. The memory 1004 (e.g., DRAM) is typically fast, but volatile, and thus a different type of storage than the mass storage device 1021 (e.g., a memory device 100), which is suitable for long-term storage, including while in an "off" condition. The instructions 1024 or data in use by a user or the machine 1000 are typically loaded in the memory 1004 for use by the processor 1002. When the memory 1004 is full, virtual space from the mass storage device 1021 can be allocated to supplement the memory 1004; however, because the mass storage device 1021 is typically slower than the memory 1004, and write speeds are typically at least twice as slow as read speeds, use of virtual memory can greatly reduce user experience due to storage device latency (in contrast to the memory 1004, e.g., DRAM). Further, use of the mass storage device 1021 for virtual memory can greatly reduce the usable lifespan of the storage device 1021.

In contrast to virtual memory, virtual memory compression (e.g., the Linux® kernel feature "ZRAM") uses part of the memory as compressed block storage to avoid paging to the mass storage device 1021. Paging takes place in the compressed block until it is necessary to write such data to the mass storage device 1021. Virtual memory compression increases the usable size of memory 1004, while reducing wear on the mass storage device 1021.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1024 can further be transmitted or received over a communications network 1026 using a transmission medium via the network interface device 1020 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1020 can include one or more physical jacks (e.g., Ethernet, coaxial, or phone jacks) or one or more antennas to connect to the communications network 1026. In an example, the network interface device 1020 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium capable of storing, encoding or carrying instructions for execution by the machine 1000, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, i.e., a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but can instead be generally perpendicular to the surface of the substrate, and can form an acute angle with the surface of the substrate (e.g., between 60 and 120 degrees, etc.).

In some embodiments described herein, different doping configurations can be applied to a source-side select gate (SGS), a control gate (CG), and a drain-side select gate (SGD), each of which, in this example, can be formed of or at least include polysilicon, with the result such that these tiers (e.g., polysilicon, etc.) can have different etch rates when exposed to an etching solution. For example, in a process of forming a monolithic pillar in a 3D semiconductor device, the SGS and the CG can form recesses, while the SGD can remain less recessed or even not recessed. These doping configurations can thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

It will be understood that when an element is referred to as being "on," "connected to" or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

OTHER NOTES AND EXAMPLES

Example 1 is a memory system comprising: a memory array comprising non-volatile memory cells; a memory controller comprising one or more hardware processors, the memory controller configured to perform operations comprising: receiving a read command to read a page of the memory array; determining whether a charge loss compensation is to be applied for the read command; responsive to determining that the charge loss compensation is to be applied to the read command, setting a read parameter based upon an estimated charge loss of the page; and reading the page using the read parameter and a read voltage, the read voltage different than the reference read level voltage.

In Example 2, the subject matter of Example 1 includes, wherein the operations of setting the read parameter based upon the estimated charge loss of the page comprises: estimating a charge loss of a second page by counting a number of bits read in the second page resulting from applying a defined read voltage; and setting the read parameter based upon the estimated charge loss of the second page.

In Example 3, the subject matter of Example 2 includes, wherein the operations of estimating the charge loss are performed prior to receiving the read command as a background process.

In Example 4, the subject matter of Examples 1-3 includes, wherein the read parameter is a Vpass voltage.

In Example 5, the subject matter of Examples 1-4 includes, wherein the read parameter is a read-retry parameter.

In Example 6, the subject matter of Examples 1-5 includes, wherein the read parameter is a read-retry parameter and a Vpass voltage.

In Example 7, the subject matter of Examples 1-6 includes, wherein the operations of determining whether the charge loss compensation is to be applied comprises: determining a classification for data in a block in which the page is stored as either random access or sequential; and responsive to determining that the data in the block is random access, determining to apply the charge loss compensation feature.

In Example 8, the subject matter of Examples 1-7 includes, wherein the one or more hardware processors are configured to execute instructions stored in the memory system, and when executed, cause the one or more processors to perform the operations.

Example 9 is a method performed by a controller of a memory system, the method comprising: receiving a read command to read a page of a memory array; determining whether a charge loss compensation is to be applied for the read command; responsive to determining that the charge loss compensation is to be applied to the read command, setting a read parameter based upon an estimated charge loss of the page; and reading the page using the read parameter and a read voltage, the read voltage different than the reference read level voltage.

In Example 10, the subject matter of Example 9 includes, wherein setting the read parameter based upon the estimated charge loss of the page comprises: estimating a charge loss of a second page by counting a number of bits read in the second page resulting from applying a defined read voltage; and setting the read parameter based upon the estimated charge loss of the second page.

In Example 11, the subject matter of Example 10 includes, wherein estimating the charge loss are performed prior to receiving the read command as a background process.

In Example 12, the subject matter of Examples 9-11 includes, wherein the read parameter is a Vpass voltage.

In Example 13, the subject matter of Examples 9-12 includes, wherein the read parameter is a read-retry parameter.

In Example 14, the subject matter of Examples 9-13 includes, wherein the read parameter is a read-retry parameter and a Vpass voltage.

In Example 15, the subject matter of Examples 9-14 includes, wherein determining whether a charge loss compensation feature is to be applied comprises: determining a classification for data in a block in which the page is stored as either random access or sequential; and responsive to determining that the data in the block is random access, determining to apply the charge loss compensation feature.

Example 16 is a non-transitory machine-readable medium, storing instructions, which when executed by a processor of a memory system, causes the processor to perform operations comprising: receiving a read command to read a page of the memory array; determining whether a charge loss compensation is to be applied for the read command; responsive to determining that the charge loss compensation is to be applied to the read command, setting a read parameter based upon an estimated charge loss of the page; and reading the page using the read parameter and a read voltage, the read voltage different than the reference read level voltage.

In Example 17, the subject matter of Example 16 includes, wherein the operations of setting the read parameter based upon the estimated charge loss of the page comprises: estimating a charge loss of a second page by counting a number of bits read in the second page resulting from applying a defined read voltage; and setting the read parameter based upon the estimated charge loss of the second page.

In Example 18, the subject matter of Example 17 includes, wherein the operations of estimating the charge loss are performed prior to receiving the read command as a background process.

In Example 19, the subject matter of Examples 16-18 includes, wherein the read parameter is a Vpass voltage.

In Example 20, the subject matter of Examples 16-19 includes, wherein the read parameter is a read-retry parameter.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The invention claimed is:

1. A memory system comprising:
a memory array comprising non-volatile memory cells;
a memory controller comprising one or more hardware processors, the memory controller configured to perform operations comprising:
during a period when the memory controller is idle:
applying a first read voltage to a first page of the memory array;
determining a number of bits read in the first page as a result of the application of the first read voltage; and
estimating a charge loss of a second page based upon the number of bits;
at a later time when the memory controller is not idle:
receiving a read command to read the second page of the memory array;
determining whether a charge loss compensation is to be applied for the read command;
responsive to determining that the charge loss compensation is to be applied to the read command, setting a read parameter based upon the estimated charge loss of the second page; and
reading the second page using the read parameter and a second read voltage, the second read voltage different than a reference read level voltage; and
wherein the operations of determining whether the charge loss compensation is to be applied comprises:
determining a classification for data in a block in which the first page is stored as either random access or sequential; and
responsive to determining that the data in the block is random access, determining to apply the charge loss compensation.

2. The memory system of claim 1, wherein the read parameter comprises one or more of a Vpass voltage or a read-retry parameter.

3. The memory system of claim 1, wherein the operations of estimating a charge loss of the second page based upon the number of bits comprises weighting a calculated charge loss of the first page based upon one or more of: a temporal proximity or a physical proximity of the first page to the second page, the temporal proximity describing how close in time data was written to the first page to when data was written to the second page, the physical proximity describing how close on a die structure the first and second pages are.

4. The memory system of claim 1, wherein the operations of applying the first read voltage to the first page of the memory array, determining the number of bits read in the first page as a result of the application of the first read voltage; and estimating a charge loss of the second page based upon the number of bits are performed periodically according to a defined periodicity.

5. The memory system of claim 1, wherein the operations further comprise:
applying the first read voltage to a set of test pages of the memory array;
determining the number of bits read from each page of the set of test pages as a result of the application of the first read voltage; and
estimating a charge loss of each of the test pages based upon the number of bits; wherein a size of the set of test pages is determined based upon one or more of: a number of Error Correction Code errors, an age of one or more of the set of test pages, or an age of data written to one or more of the set of test pages.

6. The memory system of claim 1, wherein the operations of estimating a charge loss of the second page based upon the number of bits comprises setting the charge loss of the second page to a charge loss of the first page based upon the first page and the second page being in a same block.

7. A method performed by a memory controller of a memory system, the method comprising:
during a period when the memory controller is idle:
applying a first read voltage to a first page of a memory array of the memory system;
determining a number of bits read in the first page as a result of the application of the first read voltage; and
estimating a charge loss of a second page based upon the number of bits;
at a later time when the memory controller is not idle:
receiving a read command to read the second page of the memory array;
determining whether a charge loss compensation is to be applied for the read command;
responsive to determining that the charge loss compensation is to be applied to the read command, setting a read parameter based upon the estimated charge loss of the second page; and
reading the second page using the read parameter and a second read voltage, the second read voltage different than a reference read level voltage; and
wherein determining whether the charge loss compensation is to be applied comprises:
determining a classification for data in a block in which the first page is stored as either random access or sequential; and
responsive to determining that the data in the block is random access, determining to apply the charge loss compensation.

8. The method of claim 7, wherein the read parameter comprises one or more of a Vpass voltage or a read-retry parameter.

9. The method of claim 7, wherein estimating a charge loss of the second page based upon the number of bits comprises weighting a calculated charge loss of the first page based upon one or more of: a temporal proximity or a physical proximity of the first page to the second page, the temporal proximity describing how close in time data was written to the first page to when data was written to the second page, the physical proximity describing how close on a die structure the first and second pages are.

10. The method of claim 7, wherein applying the first read voltage to the first page of the memory array, determining the number of bits read in the first page as a result of the application of the first read voltage; and estimating a charge loss of the second page based upon the number of bits are performed periodically according to a defined periodicity.

11. The method of claim 7, wherein the method further comprises:
applying the first read voltage to a set of test pages of the memory array;
determining the number of bits read from each page of the set of test pages as a result of the application of the first read voltage; and
estimating a charge loss of each of the test pages based upon the number of bits; wherein a size of the set of test pages is determined based upon one or more of: a number of Error Correction Code errors, an age of one or more of the set of test pages, or an age of data written to one or more of the set of test pages.

12. The method of claim 7, wherein estimating a charge loss of the second page based upon the number of bits comprises setting the charge loss of the second page to a charge loss of the first page based upon the first page and the second page being in a same block.

13. A non-transitory machine-readable medium, storing instructions, which when executed by a memory controller of a memory device, causes the memory device to perform operations comprising:
   during a period when the memory controller is idle:
   applying a first read voltage to a first page of a memory array of the memory device;
   determining a number of bits read in the first page as a result of the application of the first read voltage; and
   estimating a charge loss of a second page based upon the number of bits;
   at a later time when the memory controller is not idle:
   receiving a read command to read the second page of the memory array;
   determining whether a charge loss compensation is to be applied for the read command;
   responsive to determining that the charge loss compensation is to be applied to the read command, setting a read parameter based upon the estimated charge loss of the second page; and
   reading the second page using the read parameter and a second read voltage, the second read voltage different than a reference read level voltage; and
   wherein the operations of determining whether the charge loss compensation is to be applied comprises:
   determining a classification for data in a block in which the first page is stored as either random access or sequential; and
   responsive to determining that the data in the block is random access, determining to apply the charge loss compensation.

14. The non-transitory machine-readable medium of claim 13, wherein the read parameter comprises one or more of a Vpass voltage or a read-retry parameter.

15. The non-transitory machine-readable medium of claim 13, wherein the operations of estimating a charge loss of the second page based upon the number of bits comprises weighting a calculated charge loss of the first page based upon one or more of: a temporal proximity or a physical proximity of the first page to the second page, the temporal proximity describing how close in time data was written to the first page to when data was written to the second page, the physical proximity describing how close on a die structure the first and second pages are.

16. The non-transitory machine-readable medium of claim 13, wherein the operations of applying the first read voltage to the first page of the memory array, determining the number of bits read in the first page as a result of the application of the first read voltage; and estimating a charge loss of the second page based upon the number of bits are performed periodically according to a defined periodicity.

17. The non-transitory machine-readable medium of claim 13, wherein the operations further comprise:
   applying the first read voltage to a set of test pages of the memory array;
   determining the number of bits read from each page of the set of test pages as a result of the application of the first read voltage; and
   estimating a charge loss of each of the test pages based upon the number of bits; wherein a size of the set of test pages is determined based upon one or more of: a number of Error Correction Code errors, an age of one or more of the set of test pages, or an age of data written to one or more of the set of test pages.

* * * * *